United States Patent [19]

Weiner et al.

[11] Patent Number: 5,565,377
[45] Date of Patent: Oct. 15, 1996

[54] PROCESS FOR FORMING RETROGRADE PROFILES IN SILICON

[75] Inventors: Kurt H. Weiner, San Jose, Calif.; Thomas W. Sigmon, Phoenix, Ariz.

[73] Assignee: Regents of the University of California, Oakland, Calif.

[21] Appl. No.: 329,959

[22] Filed: Oct. 27, 1994

[51] Int. Cl.$^6$ .......... H01L 21/26; H01L 21/268; H01L 21/306; H01L 21/42
[52] U.S. Cl. .............. 437/173; 437/19; 437/908
[58] Field of Search .................. 437/101, 908, 437/19, 173, 174, 907

[56] References Cited

U.S. PATENT DOCUMENTS

| | | | |
|---|---|---|---|
| 4,617,066 | 10/1986 | Vasudev | 148/1.5 |
| 5,306,651 | 4/1994 | Masumo et al. | 437/908 |
| 5,391,903 | 2/1995 | Strater et al. | 257/351 |
| 5,409,857 | 4/1995 | Watanabe et al. | 437/101 |

*Primary Examiner*—Mary Wilczewski
*Assistant Examiner*—Brian K. Dutton
*Attorney, Agent, or Firm*—Henry P. Sartorio; L. E. Carnahan

[57] ABSTRACT

A process for forming retrograde and oscillatory profiles in crystalline and polycrystalline silicon. The process consisting of introducing an n- or p-type dopant into the silicon, or using prior doped silicon, then exposing the silicon to multiple pulses of a high-intensity laser or other appropriate energy source that melts the silicon for short time duration. Depending on the number of laser pulses directed at the silicon, retrograde profiles with peak/surface dopant concentrations which vary from 1–1e4 are produced. The laser treatment can be performed in air or in vacuum, with the silicon at room temperature or heated to a selected temperature.

20 Claims, No Drawings

PROCESS FOR FORMING RETROGRADE PROFILES IN SILICON

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to annealing dopants in silicon, particularly to pulsed laser annealing of dopants in silicon, and more particularly to a process by which retrograde dopant profiles can be fabricated in single crystal or polycrystalline silicon.

Pulsed lasers have been used to anneal dopants in silicon for over two decades. The technique of pulsed laser annealing has the unique property that the silicon is melted during the process and the total thermal cycle is less than one microsecond. Compared to conventional, non-laser annealing approaches, the pulsed laser technique eliminates a substantial number of processing steps which translates into cost savings in the overall manufacturing sequence. Due to the short total thermal cycle of the pulsed laser annealing technique, such causes the molten silicon to regrow at high velocities (between 1–10 meters/second). As a result, laser annealing is a non-equilibrium process. This departure from equilibrium during the regrowth process effects a physical parameter, known as the segregation coefficient, of dopant impurities located at the liquid/solid silicon interface. Normally less than 1, the segregation coefficient for the laser process becomes greater than 1, so, unlike in conventional techniques, particular dopants accumulate in the solid rather than in the liquid. Since the molten region regrows from the bulk towards the surface, the concentration of the dopant species is largest at some point (determined by the maximum penetration depth of the molten region) away from the silicon surface.

A profile with the characteristic of the impurity concentration increasing with depth is known as retrograde, because the gradient of the profile is reversed from that which is typical in an ordinary diffusion process. Such profiles are desired in any application where a higher electrical conductivity is desired in the bulk than at the surface of the silicon. A need exists for retrograde profiles in silicon integrate circuit (IC) manufacturing to form regions known as the n- and p-well in complementary metal oxide semiconductor (CMOS) transistor technology and the buried collector layer in bipolar transistor technology. That need is filled by the process of the present invention by which retrograde impurity profiles of dopants, such as boron, phosphorous, and arsenic, can be fabricated in single crystal (crystalline) or polycrystalline silicon in a simple, flexible, and inexpensive manner. The process involves melting doped silicon with a pulsed energy source in such a manner that when the liquid silicon transforms back to solid silicon, the recrystallization rate is in the range of 0.5–15 meters per second, preferably a rate that exceeds 0.5 meters per second but is lower than 15 meters per second.

SUMMARY OF THE INVENTION

An object of the present invention is to provide a process for forming retrograde profiles in silicon.

A further object of the invention is to provide a process by which retrograde dopant profiles can be fabricated in silicon in a simple, flexible, and inexpensive manner.

A further object of the invention is to provide a process for forming retrograde profiles in crystalline and polycrystalline silicon.

Another object of the invention is to provide a process which involves introducting an n-type or p-type dopant into silicon, exposing the silicon to multiple pulses of a high intensity energy source that melts the silicon for short time durations and allows the silicon to recrystallize such that the high concentration of dopant is in the bulk of the silicon.

Another object of the invention is to form n- and p-type dopant wells in the bulk of doped silicon by exposing the silicon to a pulsed excimer laser or a pulsed x-ray source for melting the silicon in such a manner that the recrystallization rate is in the range of 0.5–15 meters per second, preferably a rate that exceeds 0.5 meters/sec. but lower than 15 meters per/sec.

Other objects and advantages of the invention will become apparent from the following description. Basically, the invention involves the formation of retrograde profiles in silicon, either previously doped crystalline or polycrystalline silicon, or introducing dopant into amorphous silicon so as to produce the retrograde profiles. More specifically, the invention involves the formation of higher dopant concentrations in the bulk than at the surface of the silicon. By this process n- and p-well regions in CMOS transistors can be formed by a simple, flexible, and inexpensive manner. For example, previously doped silicon is melted by a pulsed excimer laser such that melting is in a time frame whereby when the liquid silicon transforms back to solid silicon, the recrystallization rate exceeds 0.5 meters per second but is lower than 15 meters per second, thereby forming retrograde dopant profiles in the silicon.

The process of this invention has particular application in the manufacture of silicon integrated circuits where retrograde profiles are desired for the n- and p-well regions of CMOS transistor technology and for buried collectors in bipolar transistors.

DETAILED DESCRIPTION OF THE INVENTION

The present invention is divested a method or process for forming retrograde profiles in single crystal (crystalline) or polycrystalline silicon. The retrograde profiles may be formed in previously doped silicon or formed during the doping of the silicon. The process may be utilized, for example, for producing n- and p-well regions in the bulk of the silicon such that a higher electrical conductivity is provided in the bulk than at the surface of the silicon. Such retrograde profiles are desired in silicon integrated circuit (IC) manufacturing to form the n- and p-well regions in complementary metal oxide semiconductor (CMOS) transistors and to produce buried collector regions in bipolar transistors, for example.

Broadly, the process of this invention involves introducing an n- or p-type dopant, such as phosphorus or boron, into the silicon, or utilizing prior similarly doped silicon, then exposing the silicon to multiple pulses of a high intensity energy source, such as a pulsed excimer laser or a pulsed x-ray source, that melts at least areas of the silicon for short time durations. The silicon melting must be produced in such a manner that when the liquid silicon transforms back into solid silicon, the recrystallization rate is in the range of 0.5–15 meters per second, preferably a rate that exceeds 0.5 meters/sec. but is lower than 15 meters/sec. Depending on the number of laser pulses directed onto the silicon, retrograde profiles with peak/surface dopant concentrations which vary from 1 to 1e4 atoms per cubic centimeter are produced. The pulsed energy treatment of the silicon can be performed in air for previously doped silicon, or in vacuum where there is initial doping of the silicon, with the silicon substrate, wafer, or layer at room temperature or heated to a selected temperature.

More specifically, the invention is a process by which retrograde impurity (dopant) profiles of boron, phosphorus, arsenic, and other n-type or p-type dopants, such as boron, can be fabricated in single crystal (crystalline) or polycrystalline silicon, in a substrate, wafer or layer configuration, in a simple, flexible and inexpensive manner. The retrograde profile forming process may be combined with the initial doping procedure of the silicon in substrate, wafer or layer configuration. For example, the process consists of melting the silicon surface, or selected areas of the silicon surface, in which the dopants have been previously incorporated. The silicon melting, to a depth of 100Å to 1 µm of a substrate or layer having a thickness of 100Å to 1 µm, for example, must be produced in such a manner that when the liquid silicon transforms back into solid silicon, the recrystallization rate exceeds 0.5 meters/sec. but is lower than 15 meters/sec. This is accomplished by using a pulsed energy source, such as a pulsed excimer laser of the XeCl, XeF, KFF, and ArF type, or a pulsed x-ray source which produce an energy of 0.1 to 5 J/cm$^2$, with pulses of 10 ns to 1 µs time duration. For example, the pulsed energy source may be a XeCl excimer laser operating at a wavelength of 308 nm, producing an energy of 1 J/cm$^2$ in a time period of 35 ns, and directing 10 to 1000 pulses on prior doped silicon to melt it to a depth of 0.1 to 1 µm, whereby the peak to surface concentration of the dopant varies from 1 to 1e4 atoms/cm$^3$.

The physical characteristics of the retrograde profile are governed by the amount of impurities (dopant) initially present in the silicon, the number of times the silicon is melted and recrystallized, the rapidity of the recrystallization rate which is controlled by the deposition rate and duration of the pulsed energy used to melt the silicon and the silicon temperature, and the depth to which the silicon is melted. Using the process of this invention independent control is gained of the peak to surface concentration (which can vary from 1 to 1e4 atoms/cm$^3$), the depth of the concentration peak, the width of the high concentration region, and the width of the surface, or lower concentration, region.

The following examples set forth the process of the invention when utilized to form retrograde profiles in silicon in which the dopants have been previously incorporated, and when utilized to form retrograde profiles during the doping procedure of the silicon.

EXAMPLE 1, PRIOR DOPED SILICON

Starting with a silicon wafer that has incorporated within it a uniformly-doped profile of $10^{18}$ atoms/cm$^3$ boron to a depth greater than 450 nm, a retrograde profile with a peak located at 450 nm is fabricated by selectively illuminating the doped region using a high-intensity, pulsed XeCl excimer laser at an energy fluence of 1.75 J/cm$^2$. If the melt-regrowth process is carried out 100 times by illuminating the region with 100 laser pulses, the concentration at 450 nm depth is peaked at 4× the concentration at the surface. The peak results by the following mechanism, each time the silicon is melted it regrows epitaxially at a rate of approximately 6 m/s, which is very fast when compared to standard silicon growth processes for the melt. This high regrowth rate affects the segregation coefficient of the boron impurity such that at the liquid-solid interface there is a discontinuity in concentration that favors incorporation into the solid. As a result, every time the silicon is melted the boron concentration at the maximum melt depth of 450 nm is increased compared to the surface concentration. The width of the peak at 450 nm is very narrow if the same melting energy of 1.75 J/cm$^2$ is used each time. However, if 100 additional pulses are directed on the sample at an energy fluence of 1.7 J/cm$^2$ a second peak is produced just in front (toward the surface) of the first. The two peaks combine to form a broader, flatter peak. This process of lowering the energy and illuminating the region with additional pulses can be repeated many times to effectively produce a peak of any width. If the energy fluence is reduced in large increments, an oscillatory profile can be produced in which the multiple narrow peaks are distributed through the depth of the profile. The only constraint on the process is that peaks must be formed from the maximum depth back to the surface. If an attempt is made to produce a peak deeper than an existing peak, the existing peak impurities will be redistributed with the molten silicon.

EXAMPLE II, INITIAL DOPING OF SILICON

If the required impurities do not already exist in the silicon, they may be incorporated into the silicon using a laser driven, predeposition doping step prior to the processing that produces the retrograde profile. The predeposition doping may be performed either by placing the silicon wafer in a vacuum cell that contains a gas ambient with the impurity present or by depositing a thin surface film such as oxide that both contains high concentrations of the desired dopants and is transparent to the laser light. When a gas ambient is used the pressure of the gas ranges from 1 mTorr to 500 Torr. For boron doping boron trichloride (BCl$_3$), boron trifluoride (BF$_3$), or diborane (B$_2$H$_6$) gases can be used. For phosphorus doping phosphorus pentaflouride (PF$_5$), phosphine (PH$_3$), or POCl can be used. For arsenic doping arsenic pentaflouride (AsF$_5$) or arsine (AsH$_3$) can be used. The gases can be pure or mixed with an inert gas such as argon with the percent of dopant gas as low as 0.1%. If a doped, transparent thin film is used the material must contain greater than 0.1% by mole fraction of the desired dopant. A typical material for this process is spin-on glass that has 2–5% of boron, phosphorus or arsenic impurities. For both gas phase and solid phase doping, the sample is irradiated by the laser beam at a fluence of 0.1 to 2 J/cm$^2$ to heat and/or melt the silicon. The heat drives diffusion of the impurities from the gas phase or surface layer into the silicon. A constant number of impurities are incorporated per laser pulse, so the total number of impurities is governed by the total number of laser pulses used during the predeposition cycle. By combining laser predeposition with laser melting, a retrograde profile can be fabricated in one simple step.

It has thus been shown that the present invention provides a process by which retrograde profiles of impurities, such as dopants, can be fabricated in silicon. The process can be utilized to produce retrograde profiles in silicon in which the dopants have been previously incorporated in silicon or during the dopant incorporation thereunto. Thus, by the process n- and p-well regions, for example can be formed in a silicon substrate or layer. The process has significant potential for the manufacture of silicon integrated circuits wherein it is desirable to have a higher concentration of dopants in the bulk rather than at the surface of the silicon. Such applications include forming the n- and p-well regions CMOS transistors and for buried collectors in bipolar transistors.

While specific materials, energy sources, parameters, and process procedures have been set forth to describe and exemplify the process of this invention, such is not intended to be limiting, modifications and changes may become apparent to those skilled in the art, and it is intended that the process be limited only by the scope of the appended claims.

We claim:

1. A process for forming at least one retrograde impurity profile in silicon, comprising:

directing pulsed energy onto a surface of the silicon having impurities and causing melting of an area of the surface onto which the pulsed energy is applied; and controlling the pulsed energy applied to the silicon to produce a recrystallization rate in the range of 0.5–15 meters per second, whereby the impurity concentration increases with depth.

2. The process of claim 1, wherein the impurities constitute at least one dopant in the silicon.

3. The process of claim 2, additionally including incorporating the at least one dopant into the silicon prior to directing the pulsed energy onto the surface thereof.

4. The process of claim 2, additionally including incorporating the at least one dopant into the silicon during melting thereof by the pulsed energy.

5. The process of claim 1, wherein the pulsed energy is produced from the group consisting of a pulsed excimer laser and a pulsed x-ray source.

6. The process of claim 1, additionally including controlling peak to surface concentration of the impurity profile in the range of 1 to 1e4 atoms/cm$^3$.

7. The process of claim 1, additionally including controlling the width of different concentration regions of the at least one retrograde impurity profile.

8. The process of claim 1, wherein impurities in the silicon comprises n-type and p-type dopants.

9. The process of claim 8, wherein the dopants are selected from the group consisting of phosphorus, boron, and arsenic.

10. The process of claim 7, wherein the pulsed energy is produced by a source selected from the group of pulsed excimer lasers and pulsed x-ray sources.

11. The process of claim 9, additionally including controlling physical characteristics of the at least one retrograde impurity profile by controlling the amount of dopant in the silicon, controlling the number of times the silicon is melted and recrystallized, controlling the rapidity of the recrystallization rate, and controlling the depth to which the silicon is melted.

12. The process of claim 11, wherein the rapidity of the recrystallization rate is controlled by the deposition rate of the dopant, deviation of the energy used to melt the silicon, and the silicon temperature.

13. The process of claim 10, additionally including a peak to surface concentration of the at least one retrograde impurity profile in the range of about 1 to about 1e4 atoms/cm$^3$.

14. A process for forming at least one retrograde profile of at least one dopant in silicon, comprising:

providing silicon with at least one dopant incorporated therein;

melting areas of silicon by directing pulsed energy onto the areas of the silicon for a time duration, controlling the melting of the silicon such that a recrystallization rate thereof exceeds 0.5 meters per second and is lower than 15 meters per second, whereby the impurity concentration increases with depth.

15. The process of claim 14, additionally including providing the silicon with n-type and p-type dopants.

16. The process of claim 14, additionally including providing the pulsed energy from a source selected from the group of pulsed excimer lasers and pulsed x-ray sources.

17. A process for forming at least one retrograde profile of at least one dopant to be incorporated into silicon, comprising:

providing silicon to be doped, incorporating said at least one dopant into the silicon by either ion implantation or vapor-phase diffusion, and forming said at least one retrograde profile of the dopant by melting the previously doped silicon with an excimer laser beam such that a recrystallization rate in the range of 0.5–15 meters per second is achieved, whereby the impurity concentration increases with depth.

18. The process of claim 17, additionally including providing the silicon with n-type and p-type dopants.

19. The process of claim 17, additionally including controlling physical characteristics of the at least one retrograde profile so that a greater concentration of the dopant is in the bulk of the silicon compared to the surface of the silicon.

20. The process of claim 18, wherein the at least one retrograde profile of the dopant consists of a plurality of peaks which are formed by utilizing a lesser laser energy for producing each subsequent peak.

\* \* \* \* \*